(12) United States Patent
Yi et al.

(10) Patent No.: US 7,686,637 B2
(45) Date of Patent: Mar. 30, 2010

(54) ELECTRICAL SOCKET

(75) Inventors: Qi-Jin Yi, ShenZhen (CN); Jie-Feng Zhang, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/981,146

(22) Filed: Oct. 31, 2007

(65) Prior Publication Data

US 2008/0102682 A1  May 1, 2008

(30) Foreign Application Priority Data

Oct. 31, 2006  (CN) .................. 2006 2 0126667

(51) Int. Cl.
*H01R 4/50* (2006.01)
(52) U.S. Cl. .................. 439/342; 439/259
(58) Field of Classification Search .......... 439/342, 439/259, 260–262

See application file for complete search history.

(56) References Cited

U.S. PATENT DOCUMENTS

| | | | | |
|---|---|---|---|---|
| 5,454,727 A | * | 10/1995 | Hsu | 439/263 |
| 5,569,045 A | * | 10/1996 | Hsu | 439/342 |
| 6,328,586 B1 | * | 12/2001 | Lin | 439/342 |
| 6,371,785 B1 | * | 4/2002 | Howell et al. | 439/342 |
| 6,527,577 B1 | * | 3/2003 | Chen et al. | 439/342 |
| 6,638,093 B1 | * | 10/2003 | Chang | 439/342 |
| 6,746,263 B2 | * | 6/2004 | Luo | 439/342 |
| 2004/0147154 A1 | * | 7/2004 | Chang | 439/342 |

* cited by examiner

*Primary Examiner*—Hien Vu
(74) *Attorney, Agent, or Firm*—Andrew C. Cheng; Wei Te Chung; Ming Chieh Chang

(57) ABSTRACT

An electrical socket comprises an insulative housing including a base with a cover moveably assembled thereon. An actuator is arranged between the base and the cover, and has a lever and a cam device to move the cover from a first position to a second position, wherein an interengaging arrangement is arranged between the lever and the housing, and has guiding means for properly positioning the lever and the cover in the second position easily.

3 Claims, 6 Drawing Sheets

ELECTRICAL SOCKET

BACKGROUND OF THE INVENTION

1. Field of the Invention

The present invention relates generally to an electrical socket, and more particularly relates to a so-called ZIF connector, having arrangement preventing a lever from overstress while ensuring smooth interlock between the lever and a housing of the socket.

2. Background of the Invention

Zero Insertion Force (ZIF) electrical connectors have been widely used for electrically connecting two electrical interfaces such as an electrical substrate, e.g. a PCB, and an integrated circuit (IC) package, e.g. a central processing unit (CPU).

U.S. Pat. No. 6,419,514 issued to Yu on Jul. 16, 2002; and U.S. Pat. No. 5,722,848 issued to Lai on Mar. 3, 1998 disclose typical type of ZIF connectors which have been widely applied to industry. Each of the connectors generally comprises a base mountable to a PCB, a cover moveably assembles on the base and an actuator having a lever and a cam installed in the base to drive the cover to move from a first position in which a CPU can be easily seated without any inserting force, to a second position in which the CPU is drived by the cover moving to a final position in which CPU is electrically engaged with all contacts within the base. In order to ensure the electrical connection of the CPU, an interengaging arrangement is arranged between the lever and the cover for locking the cover in the second position.

As shown in FIG. 1, the connector 8 relating to the present invention comprises a base 81 mounted to a PCB. A cover 82 is moveably assembled to the base 81, and an actuator 83 is arranged between the base 81 and the cover 82. The actuator 83 comprises a cam (not shown, but disclosed in the U.S. Pat. No. 5,722,848) to move the cover 82 to slide relative to the base 81 from a first position to a second position and a lever 831. The cover 82 defines an anchor 821 which extends from one side thereof, and the lever 831 defines a recess 8311 to engageable with the anchor 821 such that the lever 831 and the cover 82 is located in the second position.

However, even such ZIF connector 8 has been widely accepted by the industry, there is still room for improving. As known to the skill in the art and end user, in order to drive the cover 82 from the first position to the second position, the lever 831 has to firstly rotate from a vertical, which can be called an opened position, to a second position in which the lever substantially lies horizontally. When the lever 831 is finally settled, the cover 82 is also locked in the second position. When the lever 831 reaches to the second, the lever 831 needs to be pried outwards firstly so as to overcome a huddle of the anchor 821, and then swings back such that the recess 8311 could engages with the anchor 821 of the cover 82. In this critical movement, the lever can be damaged or broken if care is not taken.

Recently, a so-called LGA (land grid array) socket has been introduced to provide more advanced performance of computer, such as disclosed in U.S. Pat. No. 6,877,990 issued to Liao on Jul. 3, 2003; U.S. Pat. No. 6,780,041 issued to Ma on Oct. 7, 2003; U.S. Pat. No. 7,001,197 issued to Shiral on Oct. 30, 2003; and U.S. Pat. No. 7,140,901 issued to Lin on Dec. 5, 2005. The LGA electrical connector generally comprises an insulate housing assembled with a plurality of electrical contacts, a stiffener surround the housing with a metal clip pivotally mounted to an first end of the stiffener, and an lever pivotally assembled to an opposite second end of the stiffener. Similar to the socket discussed above, the lever has to move from a first position, generally in vertical position, to second position, generally in horizontal position, for pressing the clip toward the housing and locking the clip toward the housing when the lever is located at the second position. Again, the stiffener includes an anchor interengages with the lever so as to lock the lever at the second position to ensure the electrical interconnection between the CPU and the housing.

Again, the lever has to be pried outwardly before it reaches to its final position. Not only this will create unwanted load to the operator, but will also impose potential damages to the lever as discussed above.

In view of the foregoing, such electrical connector with improvement is provided to enhance the operability of the socket.

SUMMARY OF THE INVENTION

It is therefore an object of the present invention to provide an electrical socket, with guiding means arranged between the lever and the housing of the socket such that the lever moves to the second position easily.

To achieve the above-mentioned objects, an electrical socket in accordance with the present invention is provided. The electrical socket comprises an insulative housing including a base with a cover moveably assembled thereon. An actuator is arranged between the base and the cover, and has a lever and a cam device to move the cover from a first position to a second position, wherein an interengaging arrangement is arranged between the lever and the housing, and has guiding means for properly positioning the lever and the cover in the second position.

As set forth forgoing, during the movement of the cover from the first position to the second position, especially close to its final position, said guiding means began to guide the lever to engage with an anchor of the socket before the cover located at the second position. By this arrangement, the lever moves from the first position to the second position easily, and tremendously lowers the potential risk discussed above.

DETAILED DESCRIPTION OF THE PREFERRED EMBODIMENT OF THE INVENTION

Hereinafter, the present invention will be described in detail with reference to the accompanying drawings.

Figure 1:
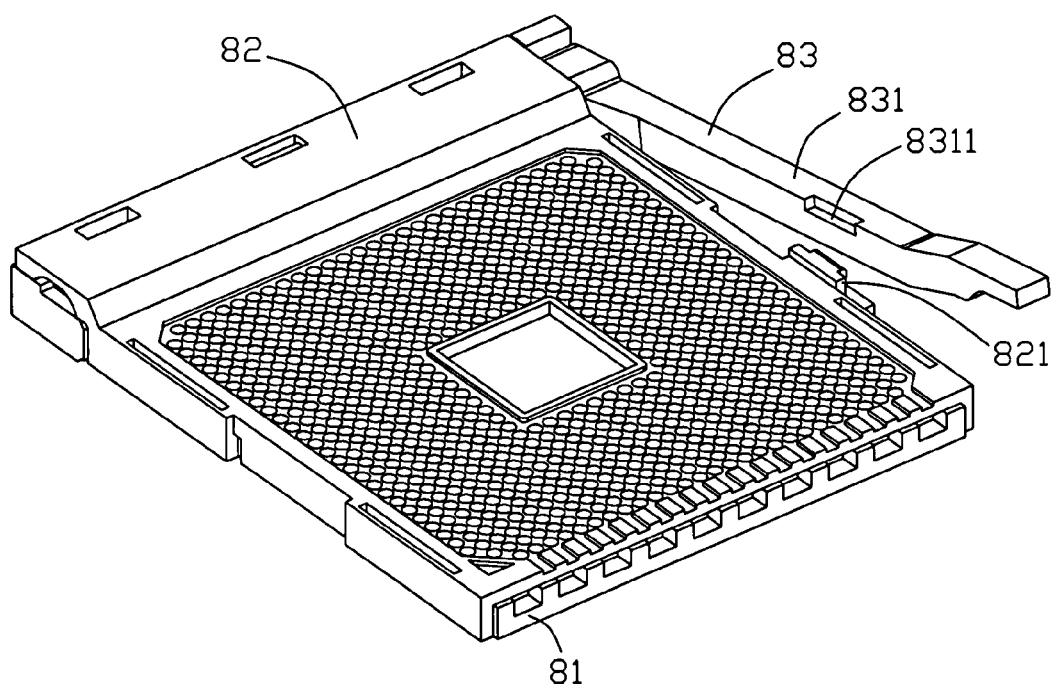
FIG. 1 illustrates a perspective view of a ZIF electrical connector relating to the present invention.
Figure 2:
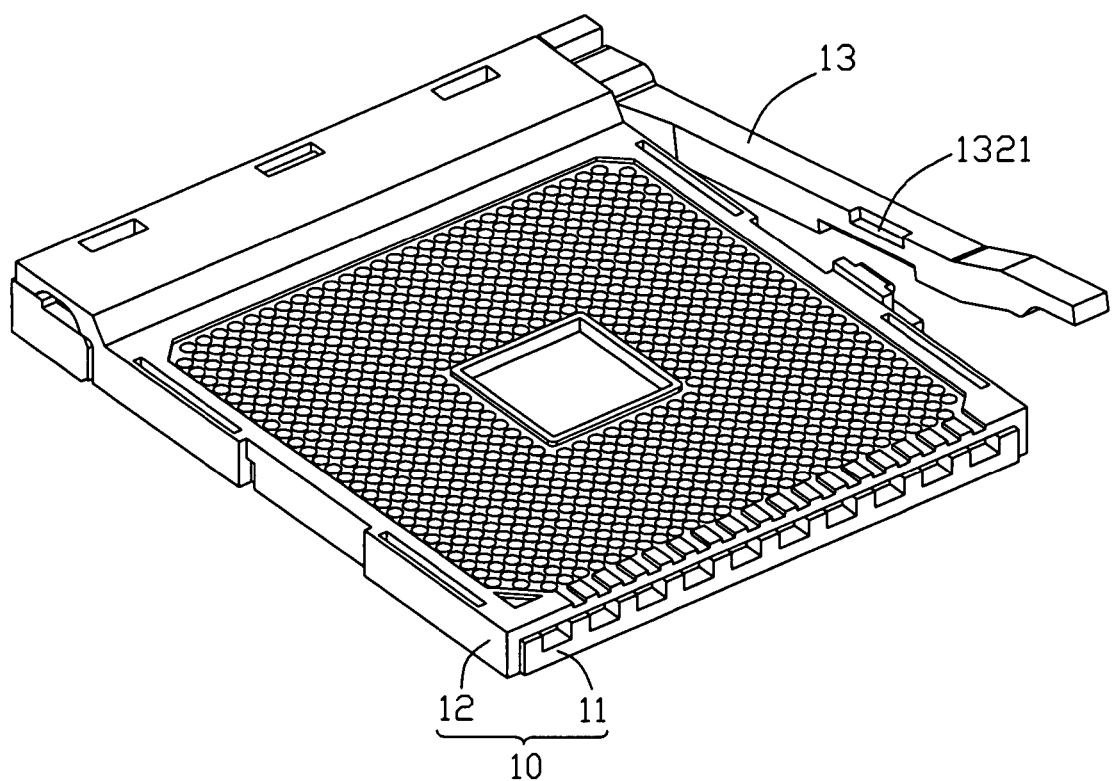
FIG. 2 illustrates an assembly view of an electrical socket in accordance with an embodiment of the present invention.
Figure 3:
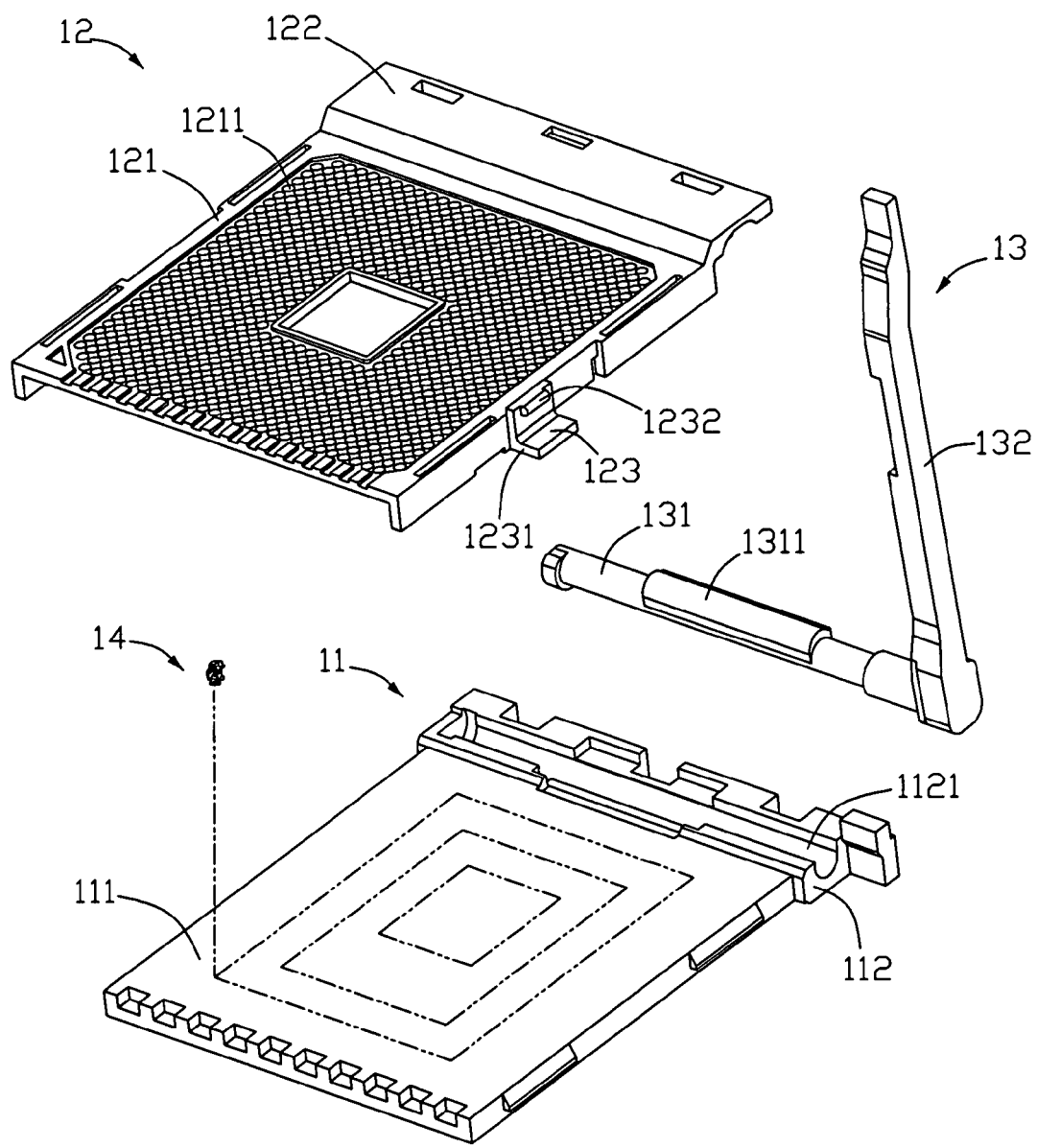
FIG. 3 is an exploded view of an electrical socket shown in the FIG. 2.
Figure 4:
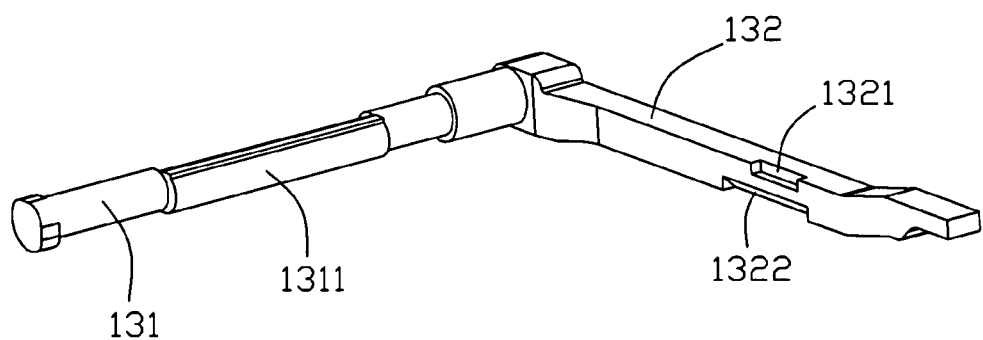
FIG. 4 depicts a perspective view of the actuator of an electrical socket.

Referring to FIGS. 2-4, a ZIF electrical socket in accordance with the first preferred embodiment of the present invention comprises a insulative housing 10 including a base 11 with a cover 12 movably assembled thereon, and a plurality of contacts 14 received in the base 11. An actuator 13 is arranged between the base 11 and the cover 12, and which has a lever 132 and a cam device 131 to drive the cover 12 from a first position to a second position.

The base 11 comprises a receiving region 111 having a number of passageways (not labeled) for receiving the contacts 14, and a first head portion 112 extending from one end of the receiving region. The first head portion 112 Defines a chamber 1121 thereon dimensioned to have the cam device 131 rotationally received therein.

The cover 12 is moveably mounted on the upper surface of the base 11. The cover 12 is dimensioned to couple with the base 11. The cover 12 comprises a supporting portion 121 having a plurality of through holes 121 corresponding to said passageways of the base 11 such that enables the pins of an IC (not shown) to be inserted into the passageway. A second head portion 122 extends from one end of the base and corresponding to the first head portion 112 of the base 11. The second head portion 122 also defines a chamber (not labeled) corresponding to the chamber 1121 and a receiving cavity for receiving the cam device 131 of the actuator 13 jointly with the chamber 1121.

The actuator 13 is configured by the cam device 131 arranged between the base 11 and the cover 12, and a lever 132 extending from one end of the cam device 131. The lever 132 is generally of a bar shape and defines a recess 1321 near the base 11 and the cover 12. According to one preferred embodiment of the present invention, the cover 12 forms an anchor 123 engageable with the recess 1321 when the cover 12 is located in the second position. As appreciated to the skill in the art, the lever 132 can moves from a first position to a second position such that the cam device 131 drives the cover 12 from its first position to its second position. The interengaging arrangement between the lever 132 and the cover 12 also has a guiding means for easy and smooth transition during engagement/disengagement between the anchor 123 and the recess 1321. As mentioned above, the interengaging arrangements includes the recess 1321 arranged in the lever 132, and an anchor 123 formed on the cover to be engageable with the recess 1321 when the cover 12 is located at the second position. It can be easily appreciated that the location of the anchor 123 and the recess 132 can be interchanged. The anchor 123 of the cover 12 in accordance with the preferred embodiment further includes a body 1231 extending from one side of the cover 12 and a latch 1232 engageable with the recess of the lever 132 when the cover 12 is located in the second position extending therefrom. The body 1231 of the anchor 123 is generally of an "L" shape and the anchor 123 is integrally formed with the cover 12.

The guiding means of the interengaging arrangements is a chamfer 1322 located in the bottom end of the lever 132 and corresponding to the anchor 123 of the cover 12. Also, the guiding means of the interengaging arrangement may be an opening 1322 corresponding to the anchor 123 of the cover 12, which is located in the bottom end of the lever 132 and of a curved shape. As set forth in forgoing description, during the movement of the cover 12 from its first position to its second position, said lever 132 moves from its first position to its second position and said guiding means begins to guide the recess 1321 of lever 132 to engage with the anchor 123 of cover 12 before the cover 12 and the lever 132 located in their second position, respectively. Thus, the lever 132 will not be damaged.

Figure 5:
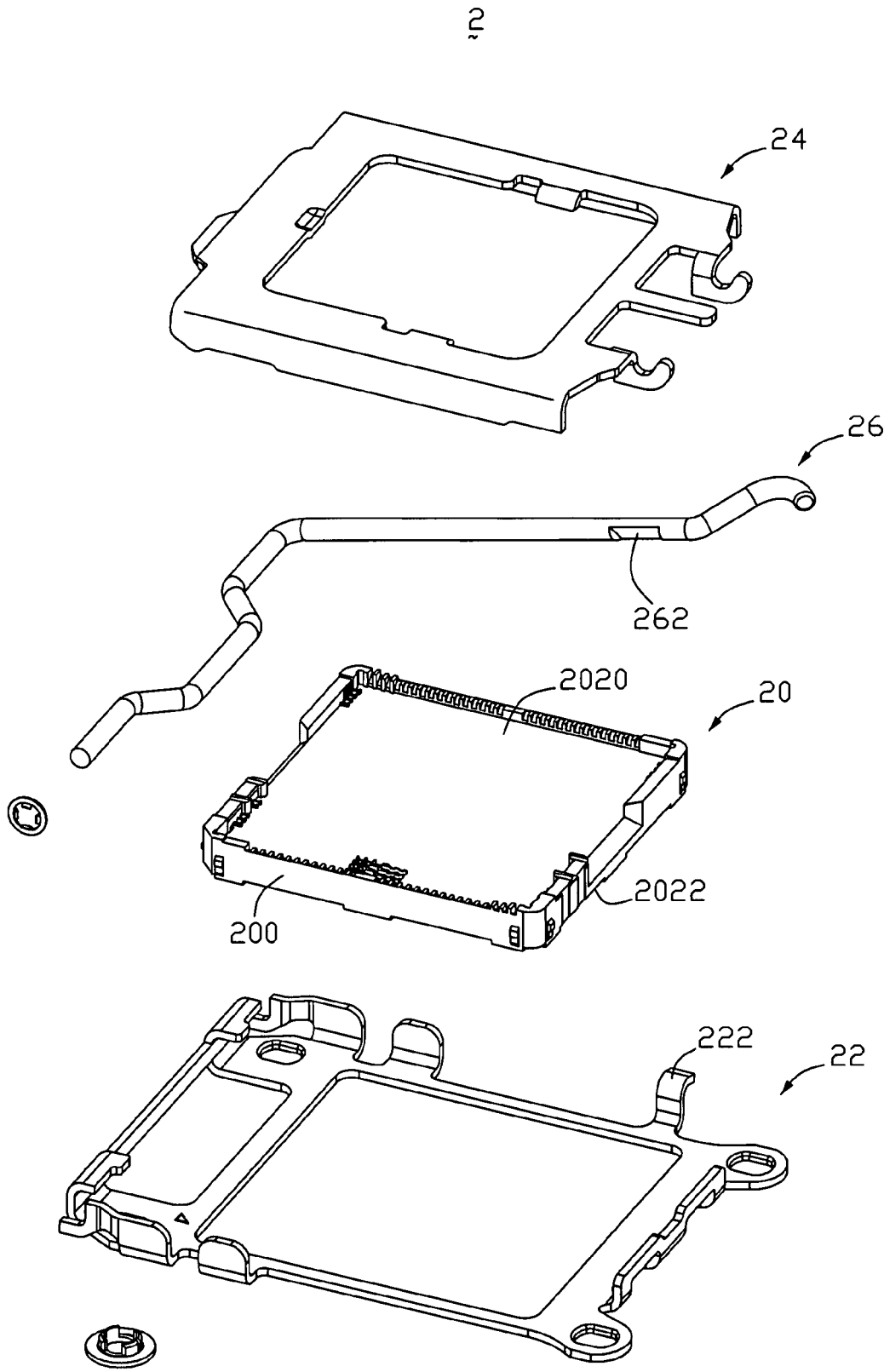
FIG. 5 depicts a assembled view of an electrical socket in accordance with another embodiment of the present invention.
Figure 6:
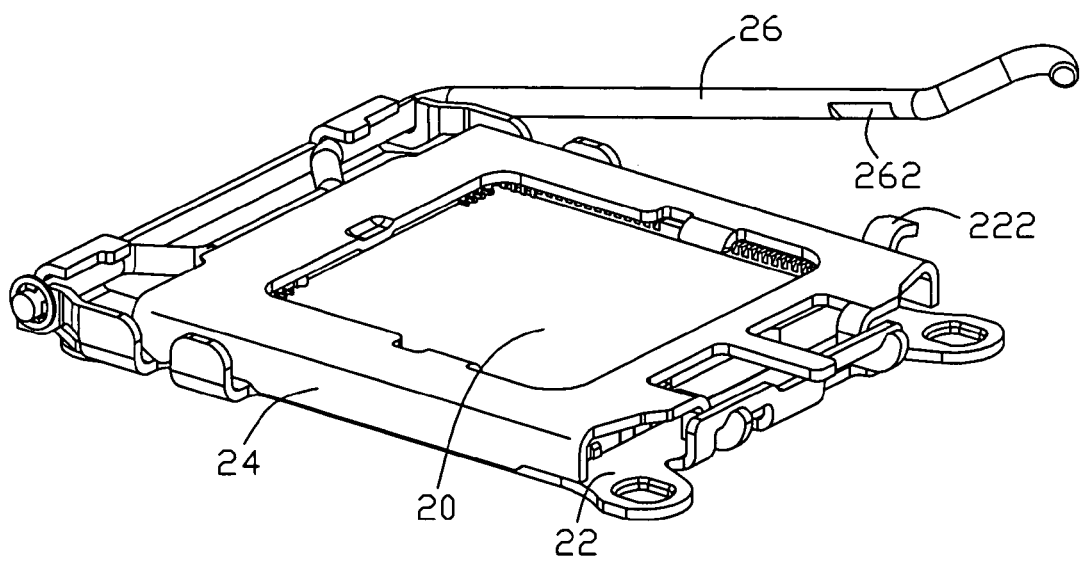
FIG. 6 depicts a assembled view of an electrical socket in accordance with another embodiment of the present invention.

FIGS. 5-6 illustrates a LGA socket in accordance with the second preferred embodiment of the present invention.

The LGA socket 2 comprises an insulative housing 20 having a base 200. The base 200 has a mating surface 2020 adapted to support an IC (not shown) and a mounting surface 2022 corresponding to the mating surface 2020, peripheral walls extending upwardly from edges of the base 200, and jointly defining a receiving space. A plurality of passageways (not shown) extends from the mating surface 2020 toward the mounting surface 2022, a plurality of contacts (not shown) received in the passageways respectively. A stiffener 22 is seated around the housing 20 and defines an opening (not labeled) in the middle thereof. A cover 24 defined with a window pivotally assembled to a first side of the stiffener 22, and a lever 26 pivotally is arranged on a second side of the stiffener 22 so as to press the cover 24 toward the stiffener 22.

As can be appreciated from the drawings, the lever 26 can moves from an open position to a closed position such that the cover 24 is pressed toward the stiffener 22 and located in a closed position. The lever 26 and the stiffener 22 define an interengaging arrangements therebetween, which includes an anchor 222 engageable with the lever 26 and arranged on the stiffener 22. Also, the interengaging arrangement between the lever 26 and the stiffener 22 has guiding means for properly positioning the lever 26 to be located in the second position. The guiding means includes an inclined surface 262 arranged on the lever 26 and corresponding to the anchor 222 of the stiffener 22.

As set forth forgoing, during the movement of the lever 26 from the open position to the closed position, the guiding means began to guide the lever 26 to engage with the anchor 222 of the stiffener 22 before the lever 26 is located in the closed position such that the lever 26 is smoothly guided into an anchor 222 formed on the stiffener 22. Therefore, the potential risk of damaging the lever 26 is efficiently reduced.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector comprising:
   an insulative housing unit including a stationary base and a cover positioned upon the base and being moveable relative to the base in a front-to-back direction;
   a plurality of contacts disposed in the base;
   an L-shaped actuator including an operation handle for driving the cover to move relative to the base in said front-to back direction; and
   an anchor portion formed on a lateral side of the cover for engaging with the operation handle;
   wherein a hallow chamfer is formed in an underside edge of the operation handle to guide the operation handle to pass over said anchor portion during downward movement of the operation handle;
   wherein said operation handle further defines a recess in an upper side in alignment with said hallow chamfer in vertical direction when said operation handle is located in a horizontal position and extends along said front-to-back direction;
   wherein the anchor portion of the cover includes a body having an anchor base extended outwardly from an edge of the cover and a latch in an upper side being aligned with the anchor base and engageable with the recess of the lever when the cover is located in the horizontal position; and
   wherein the body is generally of an L-shape.

2. The electrical socket as claimed in claim 1, wherein the anchor is integrally formed with the cover.

3. The electrical connector assembly as claimed in claim 1, wherein said anchor portion is formed on the base rather than the cover.

* * * * *